United States Patent [19]

Faure et al.

[11] 3,960,647

[45] June 1, 1976

[54] METHOD OF GROWING SINGLE CRYSTALS

[75] Inventors: Jacqueline Faure, Jarrie; Yves Malmejac, St-Egreve; Bernard Schaub, Grenoble, all of France

[73] Assignee: Commissariat a l'Energie Atomique, Paris, France

[22] Filed: May 30, 1974

[21] Appl. No.: 474,647

[30] Foreign Application Priority Data

May 30, 1973 France.............................. 73.19849

[52] U.S. Cl................................ 156/603; 148/1.5; 148/13.1; 75/65 ZM; 75/150; 75/152; 75/84; 75/67 R
[51] Int. Cl.²......................................... B01J 17/02
[58] Field of Search................... 148/1.6, 1.5, 13.1; 75/67, 65 ZM, 152, 150, 84

[56] References Cited

OTHER PUBLICATIONS

Lee et al., *Transactions,* Am. Soc. for Metals, vol. 48, 1955, pp. 13–22.

*Primary Examiner*—G. Ozaki
*Attorney, Agent, or Firm*—Sughrue, Rothwell, Mion, Zinn & Macpeak

[57] ABSTRACT

In a method of growing of single crystals which are practically free from misorientation, namely single crystals of metals which exhibit an allotropic change of state at a temperature below their melting points, single crystals of the raw metal which has undergone unidirectional solidification are heated to a temperature between the allotropic transformation point and the melting point of the metal, the single crystals are maintained during a predetermined period in the vicinity of this temperature and cooled to a temperature below the allotropic transformation point. The single crystals are then annealed in order to obtain complete recrystallization of the metal and finally cooled to room temperature.

5 Claims, No Drawings

METHOD OF GROWING SINGLE CRYSTALS

This invention relates to the growing of single crystals which are practically free from misorientation, namely single crystals of metals which exhibit an allotropic change of state at a temperature below their melting points. The invention relates in particular to the growing of single crystals of metals selected from beryllium, uranium, hafnium, praseodymium and neodymium.

Among the known methods which result in the formation of single crystals, mention can be made of the Czochralski process which consists in maintaining the starting mass at a temperature which is just higher than its melting temperature, in immersing a seed crystal in the melt and then drawing the seed crystal slowly upwards.

Another notable method is that of Bridgman in which the metal is melted in a crucible which tapers conically to a point at the bottom; the temperature within the crucible is stabilized at a value which is close to the melting point and a negative thermal gradient of a few degrees per centimeter is displaced along the crucible at a low velocity, starting from the point of the cone.

There may also be mentioned a method of fabrication of a large gadolinium crystal which is disclosed in "Journal of Applied Physics", 34, 1963, pages 3323–24 in which annealing is carried out at 1050°C for 12 hours and the temperature is increased by 50-degree increments every 12 hours to maximum of 1200° – 1225°C.

In all cases, the crystals thus obtained exhibit more or less extensive distortions which arise during cooling at the time of passing beyond the allotropic transformation point.

The misorientations which thus develop at the time of cooling are liable to attain several degrees and arise from an increase in specific volume which accompanies the transformation and from the fact that said transformation takes place by nucleation and growth.

In a single crystal of beryllium prepared by the Czochralski drawing technique, an overall misorientation of the order of 30' can be found in a small volume of the order of a few cubic millimeters; and if this misorientation is measured in a volume of crystal of the order of one cubic centimeter, said misorientation can attain and even exceed one degree. It is known that, at room temperature, beryllium is in the $\alpha$-phase and has a hexagonal structure but undergoes a transition to the $\beta$-phase shortly before attaining its melting temperature of 1280°C and then has a cubic structure.

The same phenomenon of misorientation if observed at the time of solidification of metals in which the allotropic transformation exhibits characteristics which are similar to those of beryllium.

In the case of beryllium, it would prove very difficult to endeavor to control the nucleation of the $\alpha$-phase at the time of cooling by adopting a very high thermal gradient as is the practise in liquid-solid transformation since the range of existence of the face-centered cubic phase is limited to less than 20°C below the melting point and is too small.

Furthermore, annealing in the hexagonal phase below the transformation point is not sufficient to cause elimination of the structure which is present in a crystal having a large volume of at least 1 cm³. The quality of certain types of single crystals can be improved by methods such as the Langeron and Lehr process which involves a number of cycles applied to zirconium. In this process, the zirconium is heated to the $\beta$-phase, then caused to pass from the $\beta$-phase to the $\alpha$-phase at a cooling rate of the order of 150°C per hour; annealing is then carried out for a period of 90 hours at 920°C, the transformation point being at 860°C. This cycle is repeated several times and the final dimensions of the grains depend on the number of cycles. The grain diameter which is 2 mm after one cycle increases to 10 mm after three cycles.

In the case of beryllium, it has been demonstrated that the structure created by the $\beta \rightarrow \alpha$ transformation at the time of cooling was of the same order of magnitude as the structure exhibited by the crystals of raw beryllium resulting from unidirectional solidification. In order to improve the quality of the crystals, it therefore serves no useful purpose to increase the number of cycles since each $\beta \rightarrow \alpha$ transition re-creates defects of the same order of magnitude as those which already existed.

After a large number of experiments, it has now been discovered that the disadvantages mentioned in the foregoing can be overcome by subjecting the unhardened starting mass of metal to a single thermal cycle about the allotropic transformation point and by subjecting it to an annealing operation in the hexagonal phase; this intitiates the formation of grains which are capable of growing rapidly without resulting in any appreciable misorientation.

This invention is directed to a method of growing of single crystals which are practically free from misorientation, of a metal which undergoes an allotropic transformation at a temperature below its melting point, said method being characterized in that single crystals of the raw metal which has undergone unidirectional solidification are heated to a temperature between the allotropic transformation point and the melting point of the metal, the single crystals are maintained during a predetermined period in the vicinity of this temperature and cooled to a temperature below the allotropic transformation point, said single crystals being then annealed by maintaining them at the temperature aforesaid in order to obtain complete recrystallization of the metal and finally cooled to room temperature.

In the case of application of the method to beryllium, the single crystals which have undergone unidirectional solidification are heated to a temperature within the range of 1260°C to 1280°C and then cooled at a rate of the order of 120°C per hour to 1250°C, this temperature is maintained for approximately 120 hours and cooling is carried out at a rate of 10°C per hour to 1000°C and at a rate of 100°C per hour to room temperature.

The two predominant parameters of the thermal treatment are on the one hand the rate of cooling at the moment of the $\beta \rightarrow \alpha$ transformation and on the other hand the subsequent annealing time at a temperature which is a few degrees lower than the allotropic transformation temperature. The first of these parameters controls the stresses and the defects accumulated in the sample during the transformation and accordingly governs the kinetics of subsequent recrystallization. Optimization of this parameter makes it possible to ensure that the annealing time is as short as possible. The second parameter is the interval of time during which recrystallization takes place, that is to say the time which is necessary for the elimination of grain boundaries, the shortness of this time interval being directly dependent on a judicious choice of the transformation rate.

The method according to the invention applies to massive crystals of metals which undergo an allotropic transformation in a process of nucleation and growth, the quality of the starting material being that which is obtained by unidirectional solidification. Among the metals to which the method can be applied, there can also be mentioned uranium, hafnium, praseodymium and neodymium.

The method in accordance with the invention is applicable to beryllium crystals having a copper content which can attain 0.5 atom %, thereby improving the mechanical properties of the material. The advantage of copper lies in the fact that it has a total partition coefficient which is equal to unity, a high diffusion coefficient and total solid solubility with respect to the proportion employed. Copper therefore will not produce segregations. It is also possible to employ instead of copper any other addition element having similar properties such as nickel.

It is readily apparent that impurities can be tolerated only on condition that they do not hinder the recrystallization process by formation of precipitates and the optimum conditions of the heat treatment can be modified to a slight extent as a function of the particular impurities which may be utilized.

An explanatory illustration of the invention is provided by the following example of execution:

EXAMPLE A FORMATION OF A SINGLE CRYSTAL OF BERYLLIUM

There was placed in an electric furnace of the type designated as NRC 2640 a sample of beryllium containing 0.3 atom % of copper, having the shape of a cube of edge 10 mm and having misorientations of the order of 3° within a cylindrical crucible of beryllium oxide 1.6 cm in diameter and 3 cm in height which was placed at the center of a graphite block having large dimensions compared with those of the sample in order to ensure thermal stability of the complete assembly. The effect of this arrangement was to minimize parasitic thermal gradients since the sample was placed both at the center of the graphite block and at the center of the furnace. Furthermore, this arrangement was completed by a cover in order to obtain perfect thermal symmetry. By means of a pumping set made up of a vane-type pump and an oil diffusion pump, it was possible to create a vacuum of $10^{-6}$ torr in a very short time.

The temperature of the sample was measured by means of a Pt-Pt Rh 10 % thermocouple placed in contact with the top face of the sample by means of a beryllium oxide tube. The indications of said thermocouple were followed on a recorder. A Pt-Pt Rh 10 % reference thermocouple placed in the graphite block indicated the temperature of the furnace. The electromotive forces of these two thermocouples were recorded in opposition on a second recorder, with the result that the allotropic transformation could thus be followed with a high degree of accuracy by differential thermal analysis. The presence of this device for carrying out the differential thermal analysis was necessary to ensure that the entire sample was placed within the cubic phase and to prevent any incipient melting; in point of fact, the difference between the allotropic transformation point and the melting point is less than 20°C.

Heating was carried out rapidly up to the temperature of 1270°C which was maintained for a period of 17 hours, the crystal being in the $\beta$ phase. Cooling was then carried out at a rate of 120°C per hour to a temperature of 1250°C which was maintained for 120 hours. Cooling was then carried out at a rate of 10°C down to 1000°C, then at a rate of 100°C per hour down to room temperature. The observable misorientation throughout the sample thus prepared was less than 5'.

As can be noted at least from this example, the method in accordance with the invention calls for a relatively short processing time since it is of the order of one week whereas at least four weeks are required in methods involving a number of cycles. In fact, not only does the method consists of only one cycle but, in addition, the optimization of the cooling rate at the moment of the $\beta \rightarrow \alpha$ transformation makes it possible to reduce the subsequent annealing period to the minimum value.

It may also be noted that the optimization of the transformation rate can correspond either to an optimum value of the rate of cooling of the crystal as a whole or to an optimum value of the rate of displacement of the crystal within a predetermined temperature gradient.

The single crystals obtained in the method according to the invention find a large number of applications in physics, in particular in the fabrication of neutron monochromators and in the construction of delay lines in the field of acoustics.

We claim:

1. A method of growing single crystals of a metal which exhibits an allotropic change of state at a temperature below its melting point to produce single crystals which are practically free from misorientation, comprising:

single crystals of the raw metal which has undergone an unidirectional solidification to a first temperature between the allotropic transformation point and the melting point of the metal, maintaining the single crystals for a predetermined period of time in the vicinity of said first temperature, cooling the single crystals to a second temperture below the allotropic transformation point, annealing said single crystals by maintaining them at said second temperature for a period of time sufficient to obtain complete recrystalization of the metal, and cooling the recrystalized metal to room temperature.

2. A method of growing single crystals as recited in claim 1 wherein each of the steps are carried out in at least a partial vacuum.

3. A method of growing single crystals according to claim 1 wherein the single crystals are of beryllium, said first temperature is within the range of 1260°C to 1280°C and the step of maintaining is preceded by cooling at a rate of the order of 100°C per hour to 1250°C, this temperature being maintained for approximately 120 hours, said step of cooling to said second temperature is carried out at a rate of 10°C per hour to 1000°C, and said step of cooling to room temperature is carried out at a rate of 100°C per hour.

4. A method of growing of single crystals according to claim 3, wherein the single crystals of beryllium contain impurities such as copper and nickel.

5. A method of growing of single crystals according to claim 1, wherein the single crystals are obtained from metals selected from uranium, hafnium, praseodymium and neodymium.

* * * * *